(12) United States Patent
Chen

(10) Patent No.: US 11,255,726 B1
(45) Date of Patent: Feb. 22, 2022

(54) OPTICAL SENSOR AND METHOD HAVING HIGH LINEARITY DIGITAL CONTROLLING MECHANISM

(71) Applicant: ANPEC ELECTRONICS CORPORATION, Hsinchu (TW)

(72) Inventor: Jing-Min Chen, Hsinchu (TW)

(73) Assignee: ANPEC ELECTRONICS CORPORATION, Hsinchu (TW)

( * ) Notice: Subject to any disclaimer, the term of this patent is extended or adjusted under 35 U.S.C. 154(b) by 0 days.

(21) Appl. No.: 17/207,755

(22) Filed: Mar. 22, 2021

(30) Foreign Application Priority Data

Oct. 12, 2020 (TW) .................................. 109135105

(51) Int. Cl.
| | |
|---|---|
| *G01J 1/46* | (2006.01) |
| *G01J 1/44* | (2006.01) |
| *H03F 3/08* | (2006.01) |
| *H03F 3/00* | (2006.01) |
| *G01J 1/42* | (2006.01) |
| *H04N 5/235* | (2006.01) |

(52) U.S. Cl.
CPC . *G01J 1/46* (2013.01); *G01J 1/44* (2013.01); *H03F 3/005* (2013.01); *H03F 3/082* (2013.01); *G01J 1/4204* (2013.01); *G01J 2001/4406* (2013.01); *G01J 2001/446* (2013.01); *H04N 5/2355* (2013.01)

(58) Field of Classification Search
CPC ...... G01J 1/46; G01J 1/4204; G01J 2001/446; G01J 1/44; G01J 2001/4406; H04N 5/2355; H03F 3/082; H03F 3/055
See application file for complete search history.

(56) References Cited

U.S. PATENT DOCUMENTS

| | | | | |
|---|---|---|---|---|
| 2008/0310245 | A1* | 12/2008 | Baker | ................. G11C 27/005 365/207 |
| 2015/0036005 | A1* | 2/2015 | Kelly | ................... H04N 5/2355 348/208.1 |
| 2017/0325747 | A1* | 11/2017 | Bae | ...................... A61B 5/0075 |

FOREIGN PATENT DOCUMENTS

| | | |
|---|---|---|
| TW | 200908001 A | 2/2009 |
| TW | I699973 B | 7/2020 |

* cited by examiner

*Primary Examiner* — Jennifer D Bennett
(74) *Attorney, Agent, or Firm* — Li & Cai Intellectual Property Office

(57) ABSTRACT

An optical sensor and a method having a high linearity digital controlling mechanism are provided. An optoelectronic component converts a light energy into a photocurrent. Then, the photocurrent flows to a current mirror and is amplified by a gain to form a charging current by the current mirror to charge a capacitor. A comparator compares a voltage of the capacitor with a reference voltage multiple times to generate a comparison signal. A counter determines a digital value capturing range according to the gain, and counts bit values that fall within the digital value capturing range from the comparison signal to output a counted signal. A noise cancellation processor reduces the digital value capturing range according to the gain, and removes one or more of the bit values that do not fall within the digital value capturing range from the counted signal to output a sensed signal.

10 Claims, 7 Drawing Sheets

OPTICAL SENSOR AND METHOD HAVING HIGH LINEARITY DIGITAL CONTROLLING MECHANISM

CROSS-REFERENCE TO RELATED PATENT APPLICATION

This application claims the benefit of priority to Taiwan Patent Application No. 109135105, filed on Oct. 12, 2020. The entire content of the above identified application is incorporated herein by reference.

Some references, which may include patents, patent applications and various publications, may be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD OF THE DISCLOSURE

The present disclosure relates to an optical sensor, and more particularly to an optical sensor and a method that have a high linearity digital controlling mechanism.

BACKGROUND OF THE DISCLOSURE

With the advancement of light sensing technology, various optical sensors such as ambient optical sensors have been gradually developed, and more and more diverse functions have been added to the optical sensors. The optical sensors are widely used in various portable electronic devices such as notebook computers, tablet computers, smart phones and so on. However, the existing optical sensors amplify currents in an analog manner. As a result, an amplification factor of a value sensed by the optical sensor is not proportional to a preset current factor due to characteristics of a sensing circuit structure of the optical sensor, especially when the sensed current and the amplification factor are large.

SUMMARY OF THE DISCLOSURE

In response to the above-referenced technical inadequacies, the present disclosure provides an optical sensor having a high linearity digital controlling mechanism. The optical sensor includes an optical sensor, a current mirror, a capacitor, a comparator and a digital signal processor. The optoelectronic component is configured to convert light energy irradiating through the optoelectronic component into a photocurrent. The current mirror is connected to the optoelectronic component and configured to amplify the photocurrent flowing into the current mirror by a gain to form a charging current. A first terminal of the capacitor is connected to the current mirror. The capacitor is configured to be charged by the charging current. One terminal of the comparator is connected to the first terminal of the capacitor, and another terminal of the comparator is coupled to a reference voltage. The comparator is configured to compare a voltage of the capacitor with the reference voltage for multiple times to generate a comparison signal. The digital signal processor includes a counter and a noise cancellation processor. The counter is connected to the comparator. The counter is configured to determine a digital value capturing range according to the gain. The counter is configured to read and count a plurality of bit values that fall within the digital value capturing range from the comparison signal to output a counted signal. The noise cancellation processor is connected to the counter. The noise cancellation processor is configured to reduce the digital value capturing range according to the gain. The noise cancellation processor is configured to remove a least significant bit value that does not fall within the digital value capturing range from the plurality of bit values of the counted signal. The noise cancellation processor is configured to output a sensed signal according to the bit values that are not removed from the counted signal.

In certain embodiments, the noise cancellation processor is configured to determine a number of the bit values that need be removed from the counted signal according to a light sensitivity of the optoelectronic component.

In certain embodiments, the noise cancellation processor is configured to remove one or more of the bit values that are in higher orders than that of the least significant bit value from the counted signal.

In certain embodiments, the counter is configured to generate a plurality of sub-counted signals respectively within a plurality of predetermined time intervals, and average the sub-counted signals to generate the counted signal.

In certain embodiments, the counter is configured to generate the counted signal within each of a plurality of predetermined time intervals. The noise cancellation processor determines which bits of the counted signals are in a same order and have different bit values, and removes the one or more bit values from the counted signal.

In addition, the present disclosure provides a method having a high linearity digital controlling mechanism. The method includes the following steps: converting light energy irradiating through an optoelectronic component into a photocurrent; amplifying the photocurrent by a gain to form a charging current for charging a capacitor; comparing a voltage of the capacitor with a reference voltage for multiple times to generate a comparison signal; determining a digital value capturing range according to the gain; reading and counting a plurality of bit values that fall within the digital value capturing range from the comparison signal to output a counted signal; and removing a least significant bit value that does not fall within the digital value capturing range from the bit values of the counted signal to output a sensed signal according to the bit values of the counted signal that are not removed from the counted signal.

In certain embodiments, the method includes the following step: determining a number of the bit values that need be removed from the counted signal according to a light sensitivity of the optoelectronic component.

In certain embodiments, the method includes the following step: removing one or more of the bit values that are in higher orders than that of the least significant bit value from the counted signal.

In certain embodiments, the method includes the following steps: generating a plurality of sub-counted signals respectively within a plurality of predetermined time intervals; and averaging the sub-counted signals to generate the counted signal.

In certain embodiments, the method includes the following steps: generating the counted signal within each of a plurality of predetermined time intervals; and determining which of bits of the counted signals are in a same order and have different bit values and removing the one or more bit values from the counted signal.

As described above, the present disclosure provides the optical sensor and the method that have the high linearity digital controlling mechanism, which have the following main advantages:

1. the noise interference caused by light instability and slight circuit noise is eliminated by using a digital algorithm such that the linearity of the sensed curve is effectively improved and the amplification factor of the sensed value is proportional to the preset gain amplification factor of the charging current, thereby reducing the difficulty in designing of an analog circuit;
2. the analog circuit is designed in a linear region as much as possible and only needs to provide a constant maximum current, and only bit values that fall within the digital value capturing range are captured such that the linearity of the sensed curve is effectively improved and the amplification factor of the sensed value is proportional to the preset gain amplification factor of the charging current;
3. the digital value capturing range is adjusted and even the read values are averaged to reduce an error in sensed data that is caused by instability of light and noise of the analog circuit, thereby improving a signal-to-noise ratio of the sensed data at the expense of a little response time; and
4. the error in the sensed data that is caused by noise of an external environment and the analog circuit is effectively reduced by using the digital algorithm.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The described embodiments may be better understood by reference to the following description and the accompanying drawings, in which:

FIG. 3A is a schematic diagram of a digital value capturing range of the optical sensor having the high linearity digital controlling mechanism designed to be capable of reading 20 bits at most under a condition that a gain is 1 according to the embodiment of the present disclosure;

FIG. 3B is a schematic diagram of the digital value capturing range of the optical sensor having the high linearity digital controlling mechanism designed to be capable of reading 20 bits at most under a condition that a gain is 2 according to the embodiment of the present disclosure;

FIG. 3C is a schematic diagram of the digital value capturing range of the optical sensor having the high linearity digital controlling mechanism designed to be capable of reading 20 bits at most under a condition that a gain is 4 according to the embodiment of the present disclosure;

FIG. 3D is a schematic diagram of the digital value capturing range of the optical sensor having the high linearity digital controlling mechanism designed to be capable of reading 20 bits at most under a condition that a gain is 8 according to the embodiment of the present disclosure;

FIG. 3E is a schematic diagram of the digital value capturing range of the optical sensor having the high linearity digital controlling mechanism designed to be capable of reading 20 bits at most under a condition that a gain is 16 according to the embodiment of the present disclosure;

DETAILED DESCRIPTION OF THE EXEMPLARY EMBODIMENTS

Figure 1:
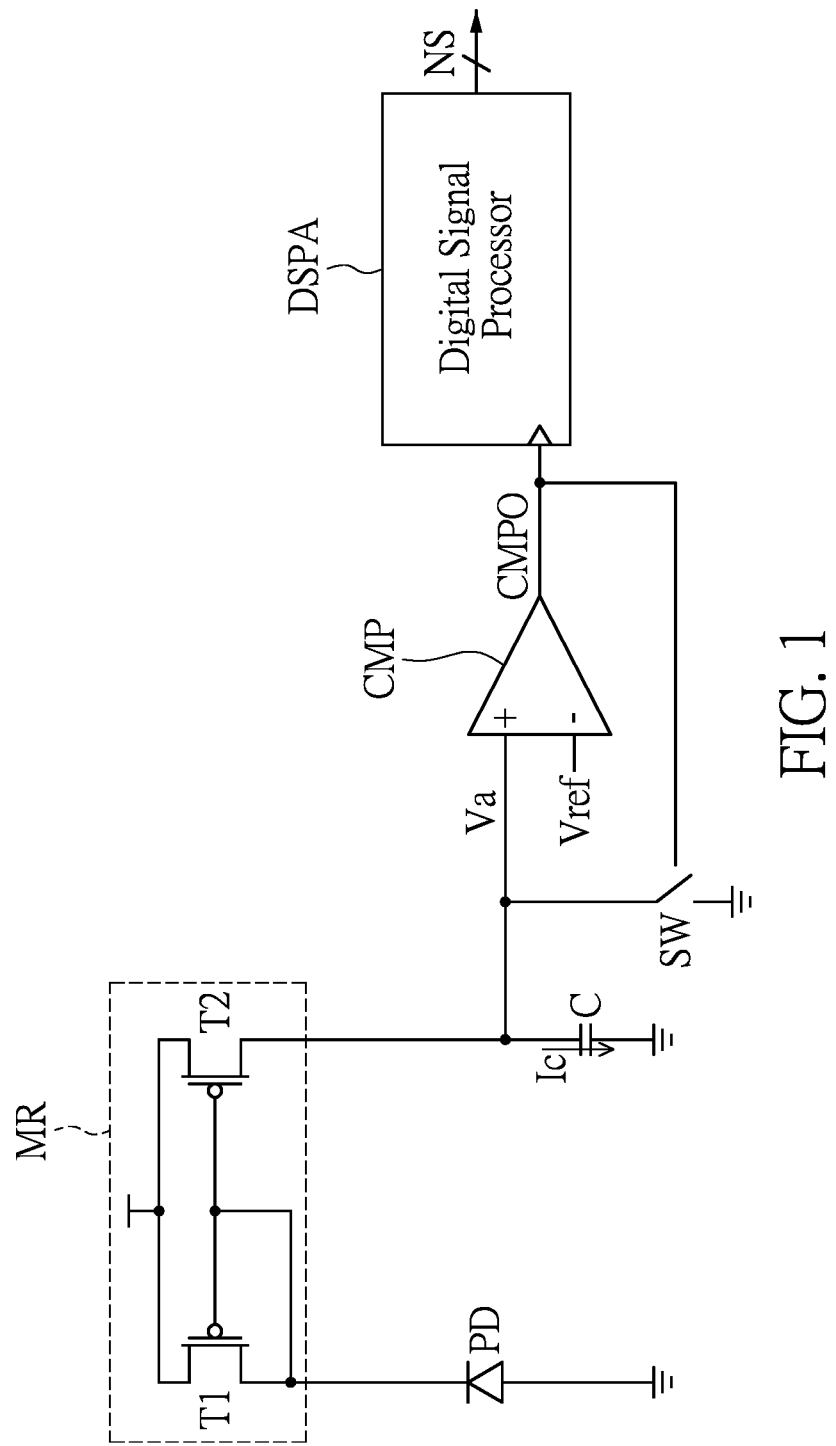
FIG. 1 is a circuit layout diagram of an optical sensor having a high linearity digital controlling mechanism according to an embodiment of the present disclosure.

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a", "an", and "the" includes plural reference, and the meaning of "in" includes "in" and "on". Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first", "second" or "third" can be used to describe various components, signals or the like, which are for distinguishing one component/signal from another one only, and are not intended to, nor should be construed to impose any substantive limitations on the components, signals or the like.

Reference is made to FIG. 1, which is a circuit layout diagram of an optical sensor having a high linearity digital controlling mechanism according to an embodiment of the present disclosure.

In the embodiment, the optical sensor may include an optoelectronic component PD, a current mirror MR, a capacitor C, a comparator CMP and a digital signal processor DSPA.

The optoelectronic component PD is connected to an input terminal of the current mirror MR, and the capacitor C is connected to an output terminal of the current mirror MR. In detail, the current mirror MR includes a first transistor T1 and a second transistor T2. A first terminal of the first transistor T1 and a first terminal of the second transistor T2 are connected to a common power source (not shown in figures). A first terminal such as a positive terminal of the optoelectronic component PD is grounded. A second terminal such as a negative terminal of the optoelectronic component PD is connected to a second terminal of the first transistor T1 of the current mirror MR. A control terminal of the first transistor T1 is connected to the second terminal of the first transistor T1 and a control terminal of the second transistor T2. A second terminal of the second transistor T2 is connected to a first terminal of the capacitor C. A second terminal of the capacitor C is grounded.

The optoelectronic component PD converts light energy irradiating through the optoelectronic component PD into a photocurrent. Then, the photocurrent flows into the current mirror MR. The current mirror MR amplifies the photocurrent flowing into the current mirror by a gain to form a charging current Ic. Then, the charging current Ic flows to the capacitor C to charge the capacitor C.

A first input terminal such as a non-inverting input terminal of the comparator CMP is connected to the first terminal of the capacitor C. A second input terminal such as an inverting input terminal of the comparator CMP is coupled to a reference voltage Vref. An output terminal of the comparator CMP is connected to the digital signal processor DSPA and a control terminal of a switch component SW. A first terminal of the switch component SW is connected to the first input terminal such as the non-inverting input terminal of the comparator CMP. A second terminal of the switch component SW is grounded.

The comparator CMP is configured to compare a voltage of the first input terminal of the comparator CMP (i.e., a voltage Va of the capacitor C) with a voltage of the second input terminal of the comparator CMP (i.e., a reference voltage Vref) multiple times to output a comparison signal CMPO to the digital signal processor DSPA. It is worth noting that, the digital signal processor DSPA is configured to perform a counting operation according to the comparison signal CMPO outputted by the comparator CMP and then perform a noise elimination operation.

After the counting operation is performed, the switch component SW is turned on by the comparison signal CMPO outputted by the comparator CMP. Under this condition, the first input terminal of the comparison signal CMPO is grounded through the switch component SW. As a result, the voltage of the first input terminal of the comparison signal CMPO is pulled down to zero to realize a resetting operation.

Figure 2:
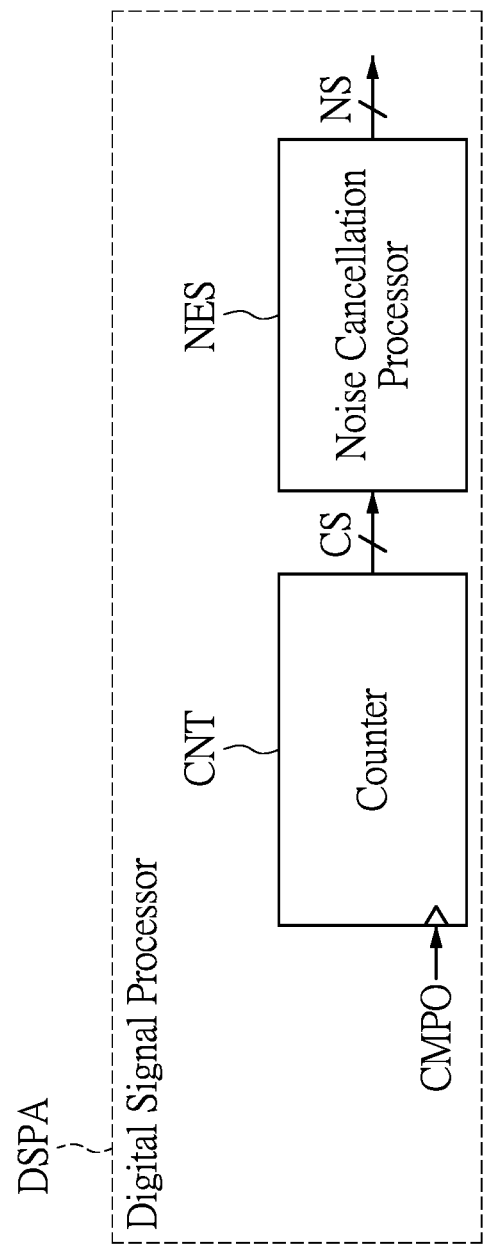
FIG. 2 is a block diagram of a digital signal processor of the optical sensor having the high linearity digital controlling mechanism according to the embodiment of the present disclosure.
Figures 3A, 3B, 3C, 3D, 3E:
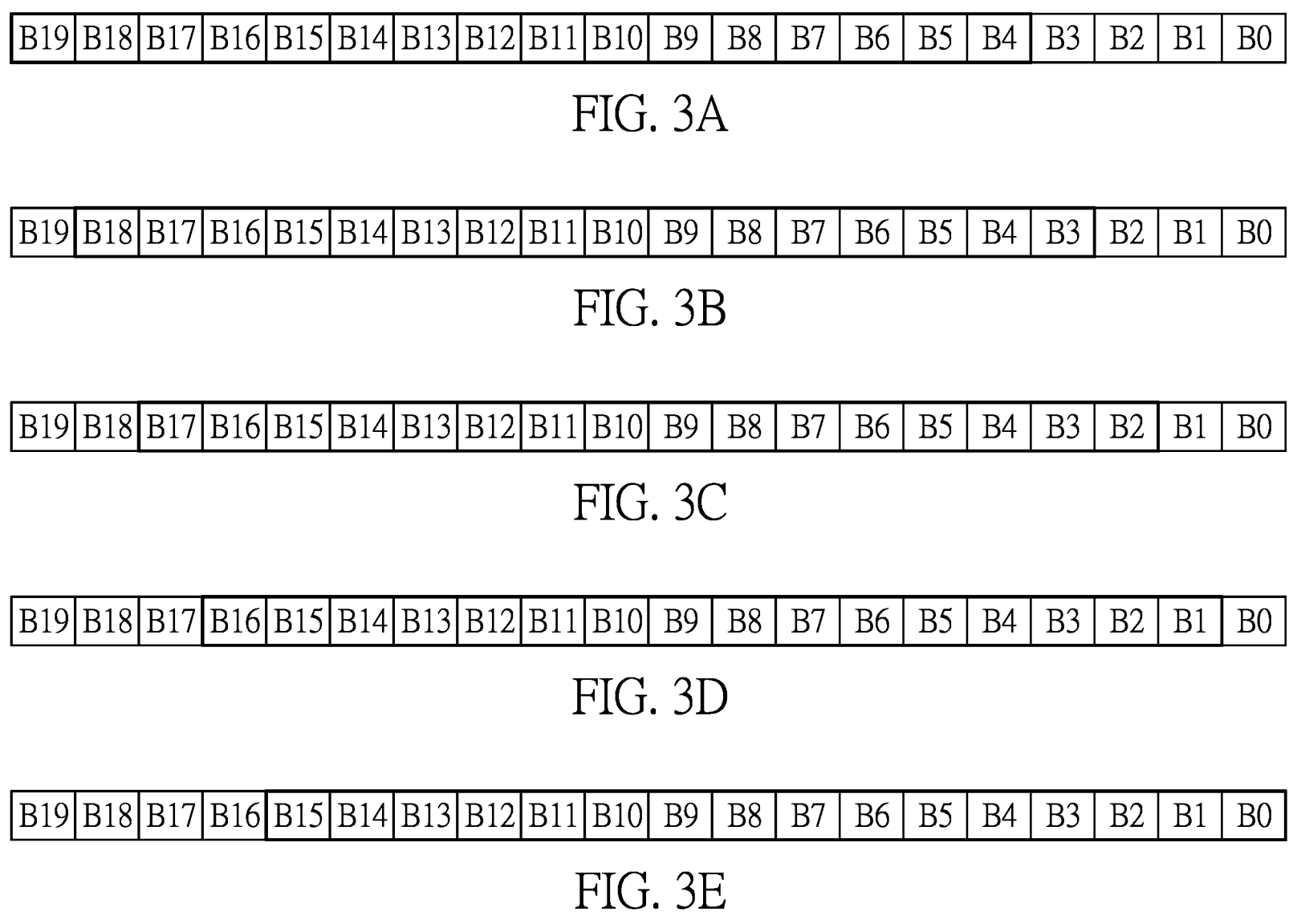
Figure 4:
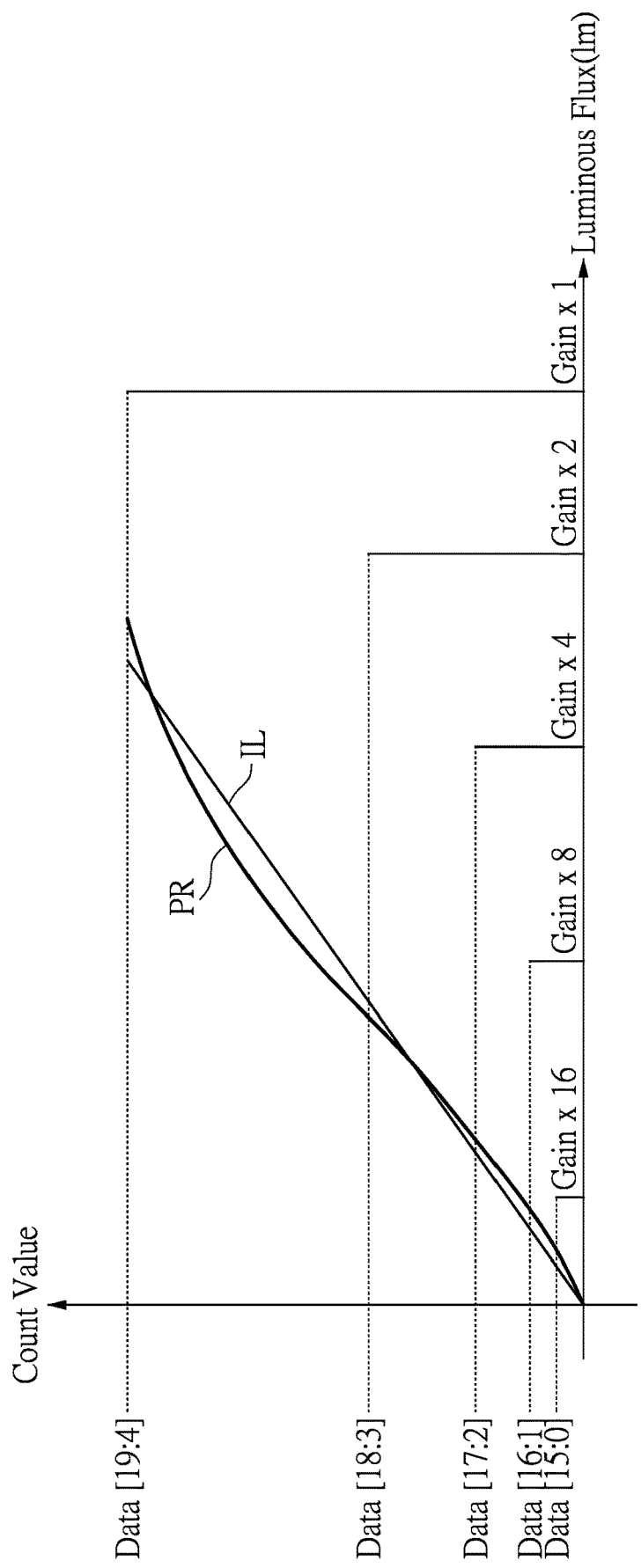
FIG. 4 is a schematic diagram of a curve of value counted by the optical sensor having the high linearity digital controlling mechanism versus a luminous flux in different gains according to the embodiment of the present disclosure.
Figure 5:
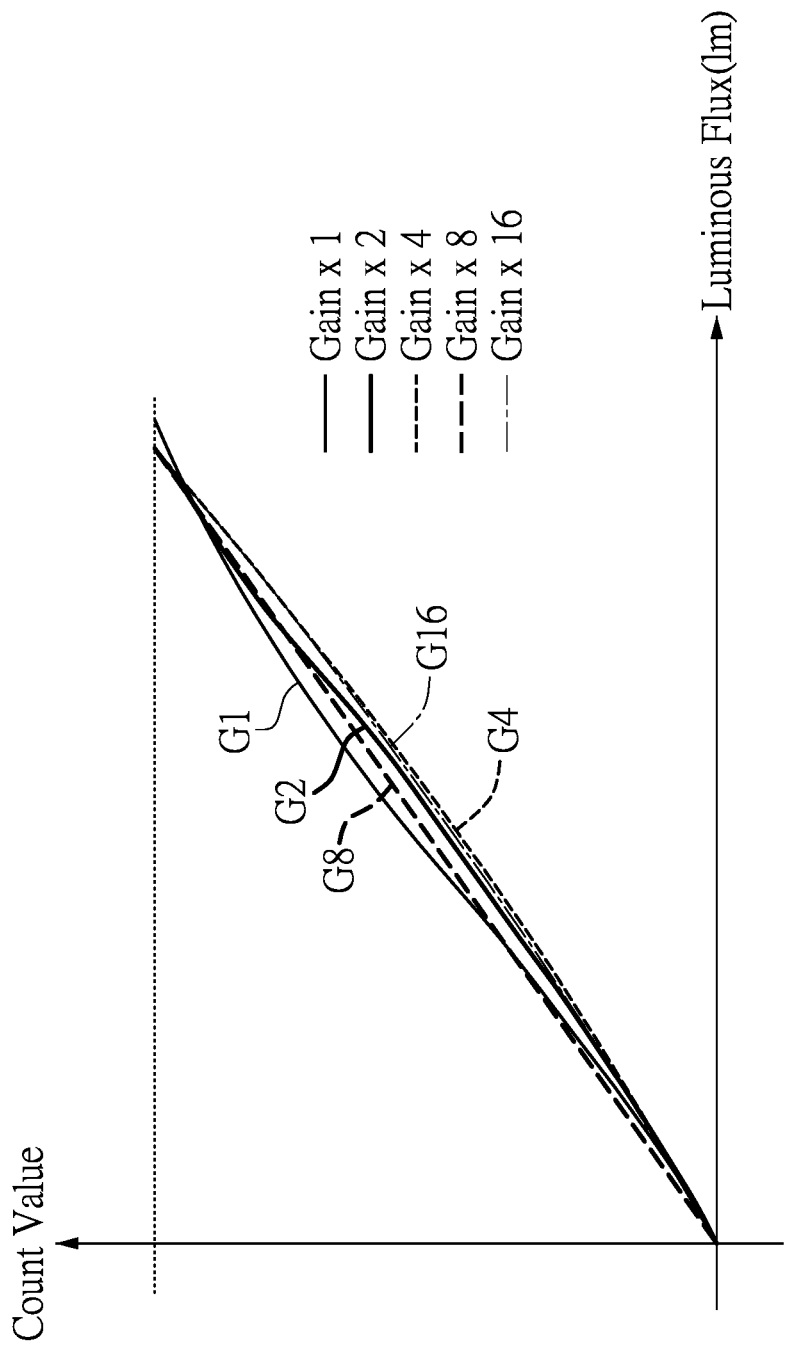
FIG. 5 is a schematic diagram of curves of value counted by the optical sensor having the high linearity digital controlling mechanism versus the luminous flux according to the embodiment of the present disclosure.

Reference is made to FIGS. 2, 3A, 3B, 3C, 3D, 3E, 4 and 5. FIG. 2 is a block diagram of the optical sensor having the high linearity digital controlling mechanism according to the embodiment of the present disclosure. FIG. 3A is a schematic diagram of a digital value capturing range of the optical sensor having the high linearity digital controlling mechanism designed to be capable of reading 20 bits at most under a condition that a gain is 1 according to the embodiment of the present disclosure. FIG. 3B is a schematic diagram of the digital value capturing range of the optical sensor having the high linearity digital controlling mechanism designed to be capable of reading 20 bits at most under a condition that a gain is 2 according to the embodiment of the present disclosure. FIG. 3C is a schematic diagram of the digital value capturing range of the optical sensor having the high linearity digital controlling mechanism designed to be capable of reading 20 bits at most under a condition that a gain is 4 according to the embodiment of the present disclosure. FIG. 3D is a schematic diagram of the digital value capturing range of the optical sensor having the high linearity digital controlling mechanism designed to be capable of reading 20 bits at most under a condition that a gain is 8 according to the embodiment of the present disclosure. FIG. 3E is a schematic diagram of the digital value capturing range of the optical sensor having the high linearity digital controlling mechanism designed to be capable of reading 20 bits at most under a condition that a gain is 16 according to the embodiment of the present disclosure. FIG. 4 is a schematic diagram of a curve of values counted by the optical sensor having the high linearity digital controlling mechanism versus luminous flux in different gains according to the embodiment of the present disclosure. FIG. 5 is a schematic diagram of curves of values counted by the optical sensor having the high linearity digital controlling mechanism versus luminous flux according to the embodiment of the present disclosure.

As shown in FIG. 2, the digital signal processor DSPA includes a counter CNT and a noise elimination processor NES. The counter CNT is connected to an input terminal of the noise elimination processor NES and the output terminal of the comparator CMP shown in FIG. 1.

The counter CNT is configured to receive the comparison signal CMPO from the comparator CMP, and then determine the digital value capturing range according to a gain amplification factor of the charging current Ic. The counter CNT reads and counts a plurality of bit values that fall within the digital value capturing range from the comparison signal CMPO to output a counted signal CS to the noise elimination processor NES.

For example, as shown in FIGS. 3A, 3B, 3C, 3D and 3E, the counter CNT is designed to read 20 bits at most. As shown in FIGS. 3A, 3B, 3C, 3D. 3E and FIG. 4, the counter CNT actually only reads 16 bit values. However, the digital value capturing range is different in different gains. In detail, as shown in FIG. 3A and FIG. 4, when the gain is 1, the counter CNT reads values of bits B4 to B19 that fall within the digital value capturing range. As shown in FIG. 3B and FIG. 4, when the gain is 2, the counter CNT reads values of bits B3 to B18 that fall within the digital value capturing range. As shown in FIG. 3C and FIG. 4, when the gain is 4, the counter CNT reads values of bits B2 to B17 that fall within the digital value capturing range. As shown in FIG. 3D and FIG. 4, when the gain is 8, the counter CNT reads values of bits B1 to B16 that fall within the digital value capturing range. As shown in FIG. 3E and FIG. 4, when the gain is 16, the counter CNT reads values of bits B0 to B15 that fall within the digital value capturing range. According to the above, the digital value capturing range of the counter CNT is different in different gains.

Figure 6:
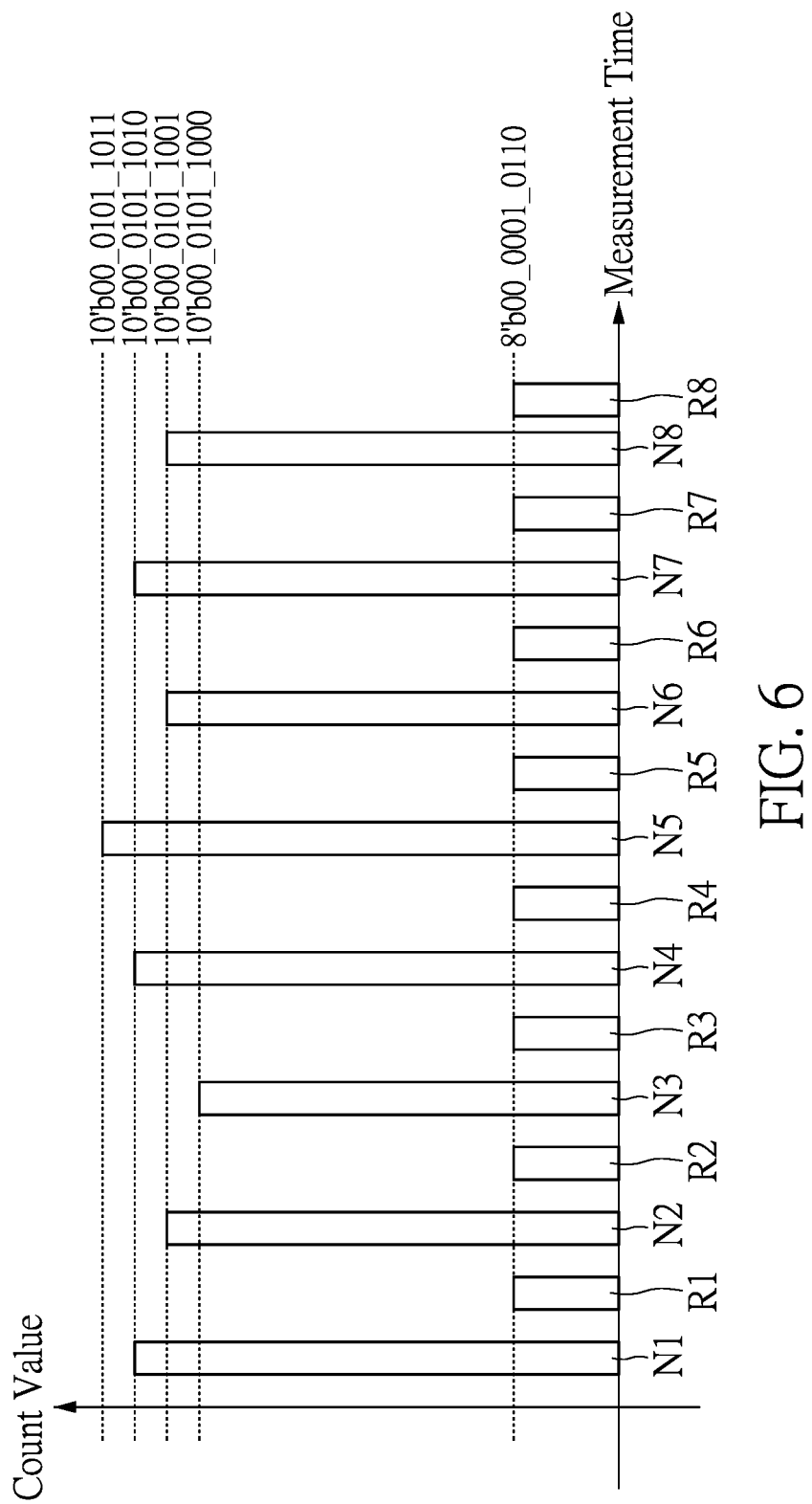
FIG. 6 is a bar graph diagram of counted value versus a measuring time of the optical sensor having the high linearity digital controlling mechanism according to the embodiment of the present disclosure.

Reference is made to FIGS. 1 to 6, in which FIG. 5 is a schematic diagram of curves of values counted by the optical sensor having the high linearity digital controlling mechanism versus luminous flux according to the embodiment of the present disclosure, and FIG. 6 is a bar graph diagram of counted value versus measuring time of the optical sensor having the high linearity digital controlling mechanism according to the embodiment of the present disclosure.

As shown in FIGS. 4 and 5, actual curves PR, G1, G2, G4, G8 and G16 of count values of the counter CNT versus luminous flux in different gain amplification factors are nonlinear. As shown in FIG. 4, a difference exists between the curve PR and an ideal curve IL. It is apparent that the amplification factor of the sensed count value is not proportional to the gain amplification factor of the charging current Ic.

The counter CNT may perform the counting operation multiple times. Each time when the counter CNT performs the counting operation once, the counter CNT counts a set of bit values. For example, as shown in FIG. 6, the counter CNT counts 10 bit values according to the comparison signal CMPO.

After the counter CNT performs the counting operation multiple times, the counter CNT counts a plurality of sets of bit values. As shown in FIG. 6, bars N1 to N8 are established in the bar graph and respectively represent the plurality of sets of bit values. Higher order 8 bits of the plurality of sets of bit values have the same values of 00010110. However, the least significant bit values and the second least significant bit values of the plurality of sets of bit values are floating. It should be understood that, the number of floating bit values may be different and depend on design of the counter, the gain amplification factor of the charging current, the number of bit values counted by the counter, interference noise, and other factors.

Therefore, the noise cancellation processor NES shown in FIG. 2 is configured to remove some of the bit values of the counted signal CS. The noise cancellation processor NES at least removes the least significant bit value from the bit values of the counted signal CS and outputs a sensed signal NS according to the remained bit values of the counted signal CS.

In other words, the noise elimination processor NES reduces the digital value capturing range. As a result, the number of bit values that fall within the digital value capturing range and thus need to be read is reduced. However, the noise elimination processor NES remains the bit values that are not floating to output the sensed signal NS. In this way, each time when the counting operation is performed, the noise cancellation processor NES always outputs the same sensed signal NS, for example, each time the sensed signal NS outputted by the noise cancellation processor NES only has 8 bit values "00010110" that are represented by bars R1 to R8 in the bar graph shown in FIG. 6.

In practice, the counter CNT may generate the counted signals CS respectively within different predetermined time intervals. The noise elimination processor NES determines which bits of the counted signals CS are in a same order and have the same bit values. For example, the counted signals CS have different least significant bit values and different second least significant bit values that will be removed. If necessary, the bit values of the counted signals CS may be averaged to obtain an average value and then the average value is compared to other average values to determine which bits are in the same order and have different bit values.

Alternatively, after the counting operation is performed, the noise elimination processor NES may determine how many bit values of the counted signal CS need to be removed according to light sensitivity of the optoelectronic component PD of the optical sensor.

Figure 7:
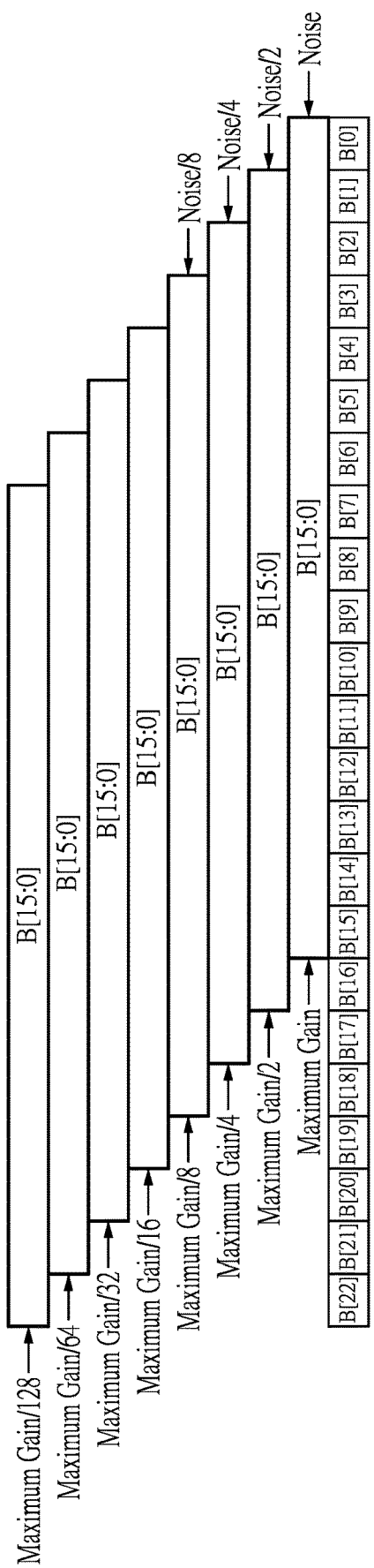
FIG. 7 is a schematic diagram of the digital value capturing range of the optical sensor having the high linearity digital controlling mechanism that shifts averagely in the different gains according to the embodiment of the present disclosure.

Reference is made to FIGS. 1 to 7, in which FIG. 7 is a schematic diagram of the digital value capturing range of the optical sensor having the high linearity digital controlling mechanism that shifts averagely in the different gains according to the embodiment of the present disclosure.

The counter CNT shown in FIG. 2 may be designed to be capable of reading 23 bits at most, but only captures 15 bits as shown in FIG. 7. The digital value capturing range of the counter CNT is bits B[0] to B[15] in a maximum gain of the charging current Ic. If the digital value capturing range of the counter CNT is bits B[1] to B[16] and bit B[0] is not captured, a gain is equal to the maximum gain divided by 2. If the digital value capturing range of the counter CNT is bits B[2] to B[17], a gain is equal to the maximum gain divided by 4. If the digital value capturing range of the counter CNT is bits B[3] to B[18], a gain is equal to the maximum gain divided by 8. If the digital value capturing range of the counter CNT is bits B[4] to B[19], a gain is equal to the maximum gain divided by 16. If the digital value capturing range of the counter CNT is bits B[5] to B[20], a gain is equal to the maximum gain divided by 32. If the digital value capturing range of the counter CNT is bits B[6] to B[21], a gain is equal to the maximum gain divided by 64. If the digital value capturing range of the counter CNT is bits B[7] to B[22], a gain is equal to the maximum gain divided by 128.

According to above, the digital value capturing range of the counter CNT shifts averagely, which is equivalent to the bit values divided by the gain. As a result, noise can be eliminated from the counted signal. The amplification factor of the sensed value is proportional to the preset gain amplification factor of the charging current Ic to finally obtain the correct the counted signal.

In summary, the present disclosure provides the optical sensor and method that has the high linearity digital controlling mechanism, which has the following main advantages:

1. the noise interference caused by light instability and slight circuit noise is eliminated by using a digital algorithm such that the linearity of the sensed curve is effectively improved and the amplification factor of the sensed value is proportional to the preset gain amplification factor of the charging current, thereby reducing the difficulty in the designing of an analog circuit;
2. the analog circuit is designed in a linear region as much as possible and only needs to provide a constant maximum current, and only bit values that fall within the digital value capturing range are captured such that the linearity of the sensed curve is effectively improved and the amplification factor of the sensed value is proportional to the preset gain amplification factor of the charging current;
3. the digital value capturing range is adjusted and even the read values are averaged to reduce an error in sensed data that is caused by instability of light and noise of the analog circuit, thereby improving a signal-to-noise ratio of the sensed data at the expense of a little response time; and
4. the error in the sensed data that is caused by noise of an external environment and the analog circuit is effectively reduced by using the digital algorithm.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. An optical sensor having a high linearity digital controlling mechanism, comprising:
   an optoelectronic component configured to convert a light energy irradiating through the optoelectronic component into a photocurrent;
   a current mirror connected to the optoelectronic component and configured to amplify the photocurrent flowing into the current mirror by a gain to form a charging current;
   a capacitor having a first terminal connected to the current mirror and configured to be charged by the charging current;
   a comparator, wherein one terminal of the comparator is connected to the first terminal of the capacitor, another terminal of the comparator is coupled to a reference voltage, and the comparator is configured to compare a voltage of the capacitor with the reference voltage for multiple times to generate a comparison signal; and
   a digital signal processor, including:
      a counter connected to the comparator, configured to determine a digital value capturing range according to the gain, and configured to read and count a plurality of bit values that fall within the digital value capturing range from the comparison signal to output a counted signal; and
      a noise cancellation processor connected to the counter, wherein the noise cancellation processor is configured to reduce the digital value capturing range according to the gain, remove a least significant bit value that does not fall within the digital value capturing range from the plurality of bit values of the counted signal, and then output a sensed signal according to the bit values that are not removed from the counted signal.

2. The optical sensor according to claim 1, wherein the noise cancellation processor is configured to determine a number of the bit values that need be removed from the counted signal according to a light sensitivity of the optoelectronic component.

3. The optical sensor according to claim 1, wherein the noise cancellation processor is configured to remove one or more of the bit values that are in higher orders than that of the least significant bit value from the counted signal.

4. The optical sensor according to claim 1, wherein the counter is configured to generate a plurality of sub-counted signals respectively within a plurality of predetermined time intervals, and average the sub-counted signals to generate the counted signal.

5. The optical sensor according to claim 1, wherein the counter is configured to generate the counted signal within each of a plurality of predetermined time intervals, and the noise cancellation processor determines which of bits of the counted signals are in a same order and have different bit values, and removes the one or more bit values from the counted signal.

6. A method having a high linearity digital controlling mechanism, comprising the following steps:
   converting a light energy irradiating through an optoelectronic component into a photocurrent;
   amplifying the photocurrent by a gain to form a charging current for charging a capacitor;
   comparing a voltage of the capacitor with a reference voltage for multiple times to generate a comparison signal;
   determining a digital value capturing range according to the gain;
   reading and counting a plurality of bit values that fall within the digital value capturing range from the comparison signal to output a counted signal; and
   removing a least significant bit value that does not fall within the digital value capturing range from the bit values of the counted signal to output a sensed signal according to the bit values of the counted signal that are not removed from the counted signal.

7. The method according to claim 6, further comprising the following step:
   determining a number of the bit values that need be removed from the counted signal according to a light sensitivity of the optoelectronic component.

8. The method according to claim 6, further comprising the following step:
   removing one or more of the bit values that are in higher orders than that of the least significant bit value from the counted signal.

9. The method according to claim 6, further comprising the following steps:
   generating a plurality of sub-counted signals respectively within a plurality of predetermined time intervals; and
   averaging the sub-counted signals to generate the counted signal.

10. The method according to claim 6, further comprising the following steps:
    generating the counted signal within each of a plurality of predetermined time intervals; and
    determining which of bits of the counted signals are in a same order and have different bit values and removing the one or more bit values from the counted signal.

* * * * *